(12) United States Patent
Sato et al.

(10) Patent No.: US 12,294,352 B2
(45) Date of Patent: May 6, 2025

(54) STRUCTURE, PHYSICAL QUANTITY SENSOR, INERTIAL SENSOR, AND METHOD FOR MANUFACTURING STRUCTURE

(71) Applicant: SEIKO EPSON CORPORATION, Tokyo (JP)

(72) Inventors: Kenta Sato, Shiojiri (JP); Masayuki Oto, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 41 days.

(21) Appl. No.: 18/457,830

(22) Filed: Aug. 29, 2023

(65) Prior Publication Data

US 2024/0072765 A1 Feb. 29, 2024

(30) Foreign Application Priority Data

Aug. 31, 2022 (JP) ................. 2022-137817

(51) Int. Cl.
*H03H 9/215* (2006.01)
*G01C 19/5628* (2012.01)
*G01P 15/097* (2006.01)

(52) U.S. Cl.
CPC ......... *H03H 9/215* (2013.01); *G01C 19/5628* (2013.01); *G01P 15/097* (2013.01)

(58) Field of Classification Search
CPC .................................................. H03H 9/215

USPC ........................................................ 331/158
See application file for complete search history.

(56) References Cited

U.S. PATENT DOCUMENTS

| 6,293,149 B1 * | 9/2001 | Yoshida ................ G01P 15/123 73/514.01 |
| 2019/0257652 A1 | 8/2019 | Kameta |
| 2023/0032633 A1 * | 2/2023 | Sato .................... G01P 15/0802 |

FOREIGN PATENT DOCUMENTS

JP 2019-144148 A 8/2019

* cited by examiner

*Primary Examiner* — Joseph Chang
(74) *Attorney, Agent, or Firm* — Rankin, Hill & Clark LLP

(57) ABSTRACT

A structure is a structure of a quartz crystal substrate having a slit. The structure includes, as an inner wall of the slit, a first side surface, a second side surface, a first end surface, and a second end surface. The first side surface extends along a first direction which is a longitudinal direction of the slit, and the second side surface extends along the first direction. The first end surface is continuous with the first side surface and extends along a first crystal plane of the quartz crystal substrate, and the second end surface is continuous with the second side surface and extends along a second crystal plane of the quartz crystal substrate. In a plan view of the quartz crystal substrate, an intersection point where a first straight line corresponding to the first end surface and a second straight line corresponding to the second end surface intersect each other is located inside the quartz crystal substrate.

12 Claims, 16 Drawing Sheets

STRUCTURE, PHYSICAL QUANTITY SENSOR, INERTIAL SENSOR, AND METHOD FOR MANUFACTURING STRUCTURE

The present application is based on, and claims priority from JP Application Serial Number 2022-137817, filed on Aug. 31, 2022, the disclosure of which is hereby incorporated by reference herein in its entirety.

BACKGROUND

1. Technical Field

The present disclosure relates to a structure, a physical quantity sensor, an inertial sensor, a method for manufacturing the structure, and the like.

2. Related Art

JP-A-2019-144148 discloses a technique of adopting a design in which a residue is less likely to occur in consideration of a fact that a stress is likely to be concentrated on an end portion where the residue occurs depending on a crystal plane.

In a structure disclosed in JP-A-2019-144148, if end surfaces defining slit end portions of the structure forms two lines intersecting each other according to different crystal planes in a plan view, a stress is concentrated on an intersection point of the two lines.

SUMMARY

According to an aspect of the present disclosure, there is provided a structure of a quartz crystal substrate having a slit. The structure includes: as an inner wall of the slit, a first side surface extending along a first direction which is a longitudinal direction of the slit; a second side surface extending along the first direction; a first end surface continuous with the first side surface and extending along a first crystal plane of the quartz crystal substrate; and a second end surface continuous with the second side surface and extending along a second crystal plane of the quartz crystal substrate. In a plan view of the quartz crystal substrate, an intersection point where a first straight line corresponding to the first end surface and a second straight line corresponding to the second end surface intersect each other is located inside the quartz crystal substrate.

According to another aspect of the present disclosure, there is provided a physical quantity sensor including the structure described above.

According to another aspect of the present disclosure, there is provided an inertial sensor including: a first physical quantity sensor configured to detect a first physical quantity on a first detection axis; a second physical quantity sensor configured to detect a second physical quantity on a second detection axis orthogonal to the first detection axis; and a third physical quantity sensor, which is the physical quantity sensor described above, configured to detect a third physical quantity on a third detection axis orthogonal to the first detection axis and the second detection axis.

According to another aspect of the present disclosure, there is provided a manufacturing method for manufacturing a structure of a quartz crystal substrate, and the manufacturing method includes: a mask forming step of forming a mask on the quartz crystal substrate; and an etching step of forming a slit in the quartz crystal substrate by etching the quartz crystal substrate using the mask. The mask having a shape covering an intersection point where a first straight line and a second straight line intersect each other is used in the etching step. In a plan view of the quartz crystal substrate, the first straight line corresponds to a first end surface formed at an end portion of the slit and extending along a first crystal plane of the quartz crystal substrate, and the second straight line corresponds to a second end surface formed at the end portion of the slit and extending along a second crystal plane of the quartz crystal substrate.

DESCRIPTION OF EMBODIMENTS

Hereinafter, an embodiment will be described. The embodiment to be described below does not unduly limit the scope of the claims. Not all components to be described below in the embodiment are necessarily essential components. The drawings to be described below are schematic, and a shape of each element, dimensions between elements, arrangement and orientation relationships, and relationships between drawings may be different from actual ones.

1. Structure

Figure 1:
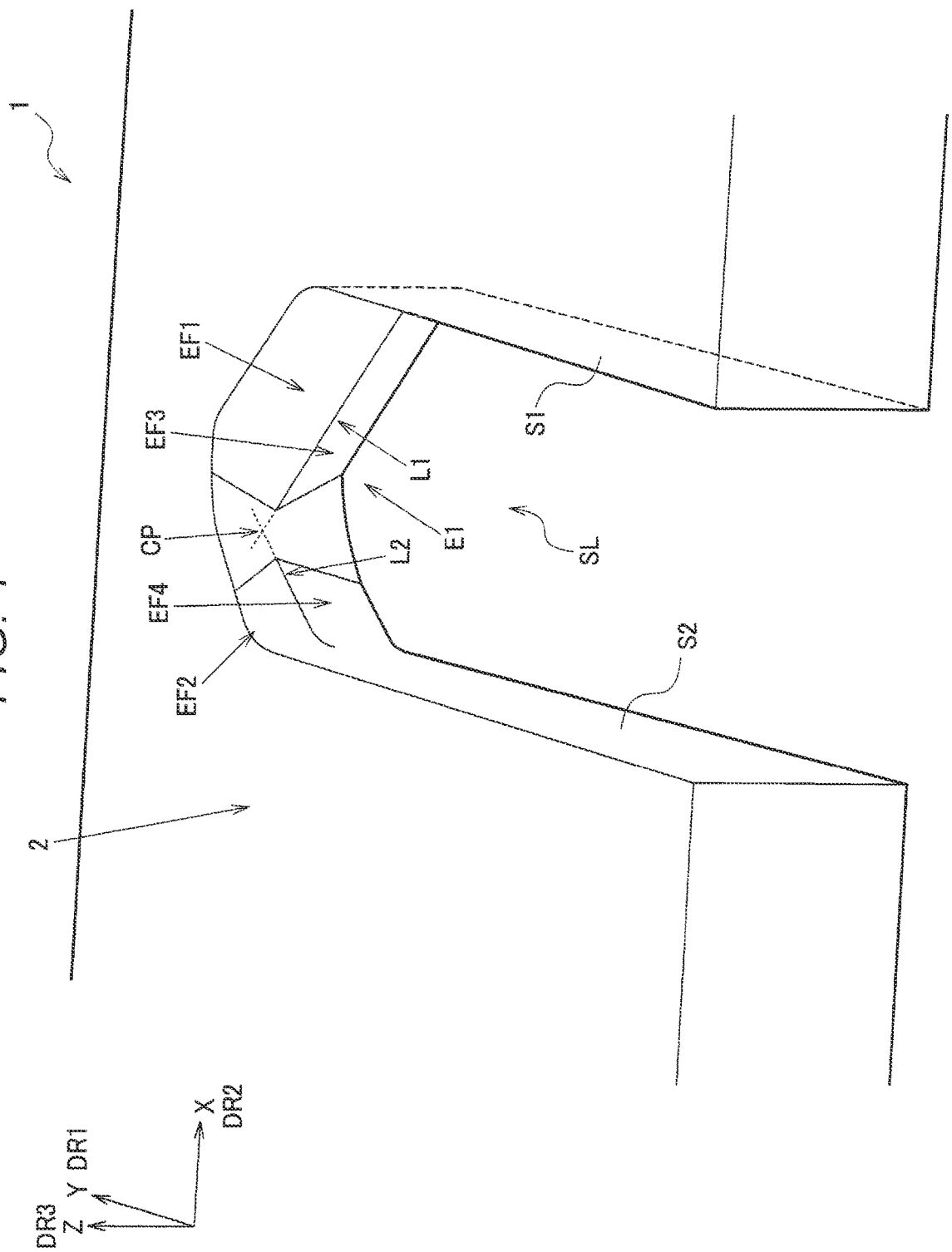
FIG. 1 is a perspective view of a structure according to an embodiment.

FIG. 1 is a perspective view of a structure 1 according to the embodiment. The structure 1 is a monolithic structure formed of a quartz crystal substrate 2. The structure 1 has a slit SL formed so as to substantially perpendicularly penetrate both main surfaces of the quartz crystal substrate 2. A first direction DR1, a second direction DR2, and a third direction DR3 are orthogonal to one another, and correspond to positive directions of a Y axis, an X axis, and a Z axis in a right-handed system of coordinates, for example. An XY plane is parallel to both main surfaces of the quartz crystal substrate 2 and is, for example, a plane including the first direction DR1 and the second direction DR2. A Z-axis direction is a direction perpendicular to the XY plane. Hereinafter, a plan view means viewing the XY plane in a −Z direction, that is, in an opposite direction to the third direction DR3. A cross-sectional view means viewing from a direction perpendicular to the third direction DR3.

The quartz crystal substrate 2 is, for example, a quartz crystal substrate including a surface along the XY plane. The quartz crystal substrate 2 is, for example, a substrate made of monocrystal of quartz crystal, and is formed to have a predetermined crystal orientation with respect to the XY plane. The X axis, a Y' axis, and a Z' axis, which are three axes orthogonal to one another, are also defined for the quartz crystal substrate 2. The X axis corresponds to an electrical axis, the Y' axis corresponds to a mechanical axis, and the Z' axis corresponds to an optical axis. The Y axis and the Z axis correspond to the Y' axis and the Z' axis rotated clockwise by a rotation angle φ when viewed in the X direction with the X axis as a rotation axis. From a viewpoint of reducing a change in a resonance frequency due to a temperature change, the rotation angle φ may be −5 degrees or more and 15 degrees or less (−5 degrees≤φ≤15 degrees).

As shown in FIG. 1, the slit SL is formed such that one end thereof is open with a direction along the first direction DR1 as a longitudinal direction in the plan view. The slit SL is formed by forming a mask material patterned in a planar shape of the slit SL on the quartz crystal substrate 2 and processing the quartz crystal substrate 2 by etching or the like, as will be described later with reference to FIGS. 14 to 17. The longitudinal direction of the slit SL in the plan view is defined as the first direction DR1 in FIG. 1, but the longitudinal direction of the slit SL may be any direction in the XY plane. That is, the longitudinal direction of the slit SL can be set to any direction with respect to a crystal orientation of the quartz crystal.

As shown in FIG. 1, the structure 1 includes an inner wall surrounding the slit SL. In FIG. 1, the inner wall of the slit SL has a substantially U shape in the plan view. The inner wall of the slit SL includes a first side surface S1 and a second side surface S2 which extend along the first direction DR1 corresponding to the longitudinal direction of the slit SL, and an end surface coupling the first side surface S1 and the second side surface S2. The first side surface S1 and the second side surface S2 face each other.

As shown in FIG. 1, an end surface in the inner wall of the slit SL coupling the first side surface S1 and the second side surface S2 is bent in a substantially U shape. Such an end portion where the end surface of the slit SL is located is referred to as a first end portion E1. In FIG. 1, a first direction DR1 side of the slit SL is the first end portion E1. Specifically, the inner wall at the first end portion E1 of the slit SL includes a first end surface EF1, a second end surface EF2, a third end surface EF3, and a fourth end surface EF4. For example, the first end surface EF1 and the third end surface EF3 are coupled by a first straight line L1, forming a ridge-shaped undulation with the first straight line L1 as a ridge line. Similarly, the second end surface EF2 and the fourth end surface EF4 are coupled by a second straight line L2, forming a ridge-shaped undulation with the second straight line L2 as a ridge line. In this way, at the first end portion E1 of the slit SL, undulations are formed on the inner wall.

Figure 2:
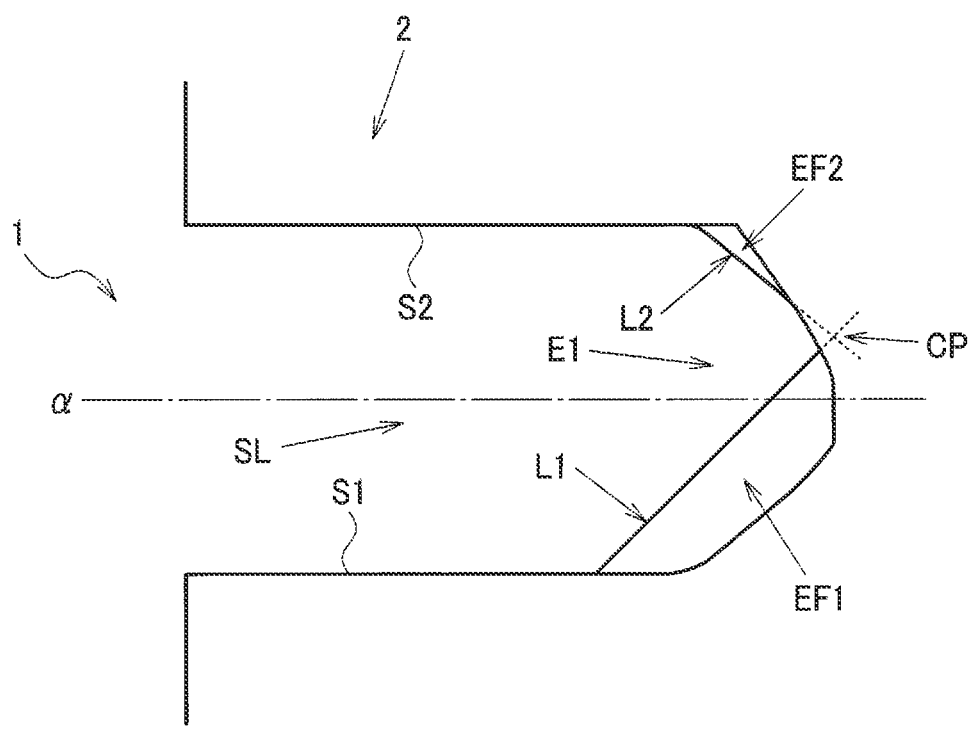
FIG. 2 is a diagram showing a shape of the structure according to the embodiment in a plan view.
Figure 2:
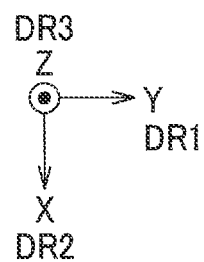

FIG. 2 is a plan view of the slit SL in the structure 1 according to the embodiment. At the first end portion E1, as a rough outline, the ridge-shaped undulations with the first straight line L1 and the second straight line L2 as ridge lines appear on the inner wall of the slit SL. Since FIG. 2 is a plan view, the first end surface EF1 and the second end surface EF2 are visible, and the third end surface EF3 and the fourth end surface EF4 are visible when viewed from an opposite direction (Z direction).

The slit SL in the structure 1 is formed by an isotropic etching process such as wet etching. At this time, an etching rate differs for each crystal plane of the quartz crystal substrate 2, and thus is also affected by anisotropy depending on a crystal orientation. Therefore, the inner wall of the slit SL is affected, in a combined manner, by isotropy of the wet etching and the anisotropy of the etching rate depending on the crystal orientation of the quartz crystal substrate. The above-described ridge-shaped undulation with the first straight line L1 or the second straight line L2 as the ridge line appears mainly as an effect of the anisotropy of the etching rate depending on the crystal orientation. For example, a main cause of the ridge-shaped undulation with the first straight line L1 or the second straight line L2 as the ridge line is that when the etching rate for a certain crystal plane is lower than the etching rate for each of other crystal planes, it is relatively difficult to etch the other crystal planes. Therefore, each of the first end surface EF1 to the fourth end surface EF4 forming a part of the ridge-shaped undulations formed on the inner wall of the slit SL corresponds to a crystal plane with a relatively low etching rate. Therefore, each of the first end surface EF1 to the fourth end surface EF4 is basically a flat surface parallel to the crystal plane, but may also be affected by the isotropic wet etching and actually be substantially planar.

As shown in FIGS. 1 and 2, in the structure 1, an intersection point of a line extending from the first straight line L1 and a line extending from the second straight line L2 is referred to as an intersection point CP. The intersection point CP is not present on a surface of the structure 1 but present inside the structure 1. A position where the intersection point CP appears changes depending on an angle between the crystal orientation of the quartz crystal substrate 2 and the longitudinal direction of the slit SL, but in the structure 1 according to the embodiment, the intersection point CP is located on a −X direction side of a central line of the slit SL indicated by a one-dot chain line α in FIG. 2.

Figure 3:
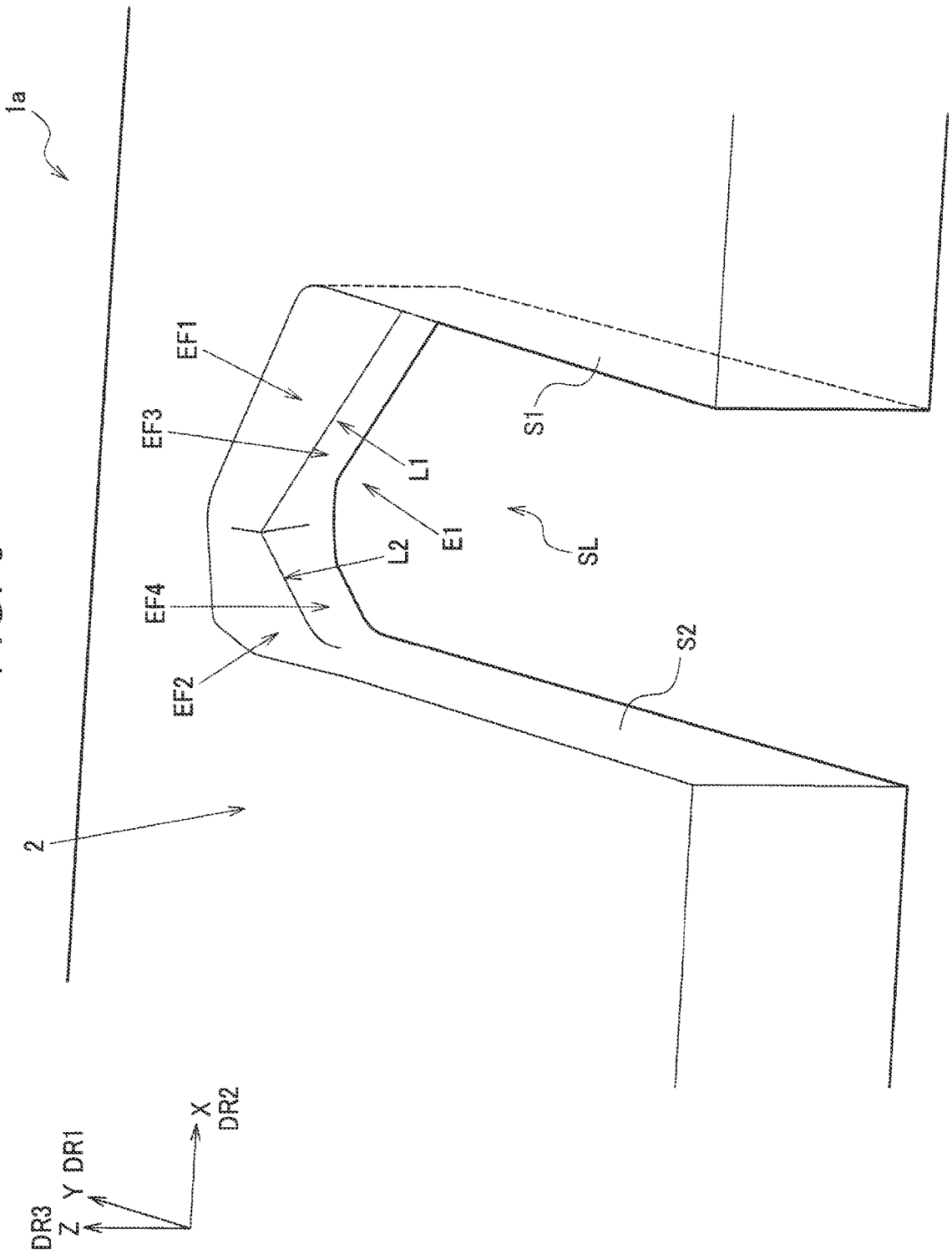
FIG. 3 is a perspective view of a structure according to a first comparative example of the embodiment.

FIG. 3 is a perspective view of a structure 1a according to a first comparative example of the embodiment. In the structure 1a, the slit SL whose longitudinal direction is the first direction DR1 is formed in the quartz crystal substrate 2 similarly to the structure 1, but a shape of an inner wall of the slit SL on a first direction DR1 side is different. Specifically, the first comparative example is different in that the intersection point CP appears on the inner wall of the slit SL.

Figure 4:
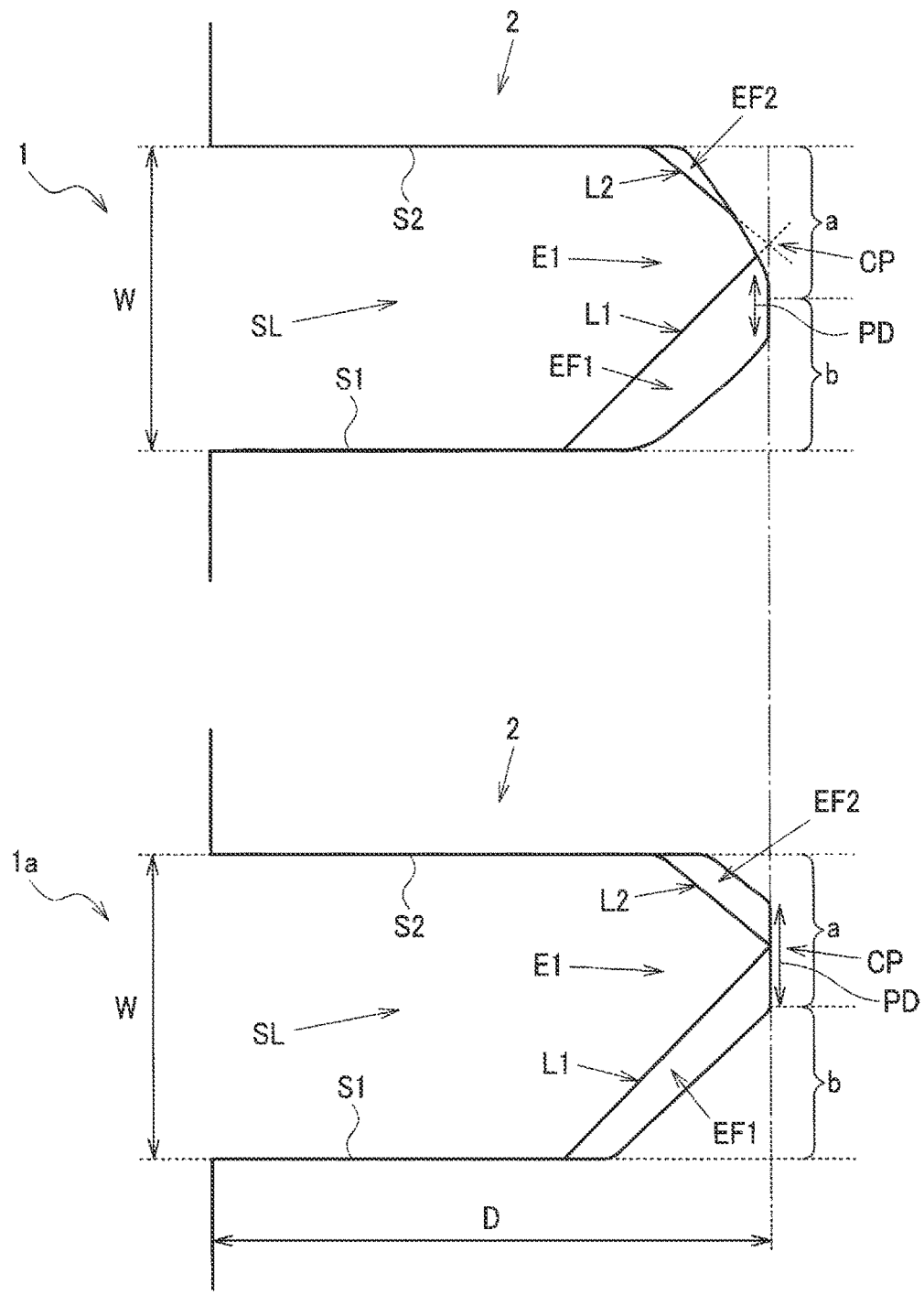
FIG. 4 is a diagram showing a difference between the structure according to the embodiment and that according to the first comparative example.

FIG. 4 is a diagram showing a difference between the structure 1 and the structure 1a in a plan view. An upper part in FIG. 4 shows a shape of the structure 1 according to the embodiment shown in FIG. 1 in the plan view, and a lower part in FIG. 4 shows a shape of the structure 1a according to the first comparative example in the plan view. As indicated by broken lines in FIG. 4, a depth D of the slit SL toward the first direction DR1 side and a slit width W in the second direction DR2 are the same between the structure 1 and the structure 1a. However, the structure 1a is different from the structure 1 in a portion PD where the depth D is the deepest at the first end portion E1 of the slit SL. Specifically, in the structure 1a, the portion PD where the depth D of the slit is the deepest is located on an opposite side of a central position in the slit width W from a second direction DR2 side. Therefore, at the portion PD where the depth of the slit SL is the deepest, the intersection point CP appears on the inner wall.

As described above, the position where the intersection point CP appears depends on how the quartz crystal substrate 2 and the slit SL are oriented. When the intersection point CP appears, for example, on an opposite side from a second direction DR2 side of the slit SL as in the embodiment, a central portion of the portion PD where the depth of the slit SL is deep is located on the second direction DR2 side as in the structure 1. For example, with this configuration, the intersection point CP appearing on the opposite side of the central line from the second direction DR2 side does not appear on the inner wall.

In FIGS. 1 to 4, it is assumed that the undulations with the first straight line L1 and the second straight line L2 as the ridge lines appear on the inner wall of the slit SL on the first direction DR1 side, and the intersection point CP appears on the opposite side of a center of the slit SL in the second direction DR2 from the second direction DR2 side. However, since the position where the intersection point CP appears depends on the angle between the crystal orientation of the quartz crystal substrate 2 and the longitudinal direction of the slit SL as described above, the position of the intersection point CP on the inner wall of the slit SL is not limited to an area indicated by a in FIG. 4, and may appear in an area indicated by b in FIG. 4. In the structure 1 according to the embodiment, the intersection point CP may be located in any one of the areas a, b on the inner wall of the slit SL. For example, when the intersection point CP appears in the area indicated by b in FIG. 4, the slit SL is formed such that the intersection point CP appearing in b does not appear on the inner wall. Specifically, in the plan view of the quartz crystal substrate 2, a shape of the slit SL is formed such that a center of the portion PD where the depth of the slit SL is the deepest is located in the area indicated by a. With such a shape of the slit SL, the intersection point CP located in the area indicated by b is covered with the first end surface EF1 and does not appear on the inner wall of the slit SL.

As described above, the structure 1 according to the embodiment is a structure of the quartz crystal substrate 2 having the slit SL. The structure includes, as the inner wall of the slit SL, the first side surface S1, the second side surface S2, the first end surface EF1, and the second end surface EF2. The first side surface S1 extends along the first direction DR1 which is the longitudinal direction of the slit SL, and the second side surface S2 extends along the first direction DR1. The first end surface EF1 is continuous with the first side surface S1 and extends along a first crystal plane of the quartz crystal substrate 2, and the second end surface EF2 is continuous with the second side surface S2 and extends along a second crystal plane of the quartz crystal substrate 2. In the plan view of the quartz crystal substrate 2, the intersection point CP where the first straight line L1 corresponding to the first end surface EF1 and the second straight line L2 corresponding to the second end surface EF2 intersect each other is located inside the quartz crystal substrate 2.

When the shape of the structure 1 is distorted, a stress thereby tends to be concentrated on the quartz crystal substrate 2 at the first end portion E1 of the slit SL. Since different crystal planes of the quartz crystal substrate 2 intersect at the intersection point CP, when the stress is concentrated, breakage starting from the intersection point CP is likely to occur along the crystal planes. However, according to the embodiment, the intersection point CP where different crystal planes of the quartz crystal substrate 2 intersect each other does not appear on the inner wall of the slit SL. Therefore, even when the structure 1 is distorted and the stress is concentrated on the inner wall of the slit SL, it is possible to prevent occurrence of breakage starting from the intersection point CP of the crystal planes.

In the structure 1 according to the embodiment, the quartz crystal substrate 2 includes, as the inner wall of the slit SL, the third end surface EF3 continuous with the first side surface S1 and extending along a third crystal plane of the quartz crystal substrate 2, and the fourth end surface EF4 continuous with the second side surface S2 and extending along a fourth crystal plane of the quartz crystal substrate 2. The first straight line L1 is a ridge line where the first end surface EF1 and the third end surface EF3 intersect each other, and the second straight line L2 is a ridge line where the second end surface EF2 and the fourth end surface EF4 intersect.

With this configuration, on the inner wall of the slit SL on the first direction DR1 side, the first end surface EF1 and the third end surface EF3 form the ridge-shaped undulation with the first straight line L1 as the ridge line. On the inner wall of the slit SL on the first direction DR1 side, the second end surface EF2 and the fourth end surface EF4 form the ridge-shaped undulation with the second straight line L2 as the ridge line. A boundary line between the first end portion E1 of the slit SL and both main surfaces of the structure 1 includes a portion along the first straight line L1 and a portion along the second straight line L2 in the plan view. The first end portion E1 of the slit SL may not have a surface parallel to the second direction DR2. This reduces an amount of residue left by the wet etching.

Figure 5:
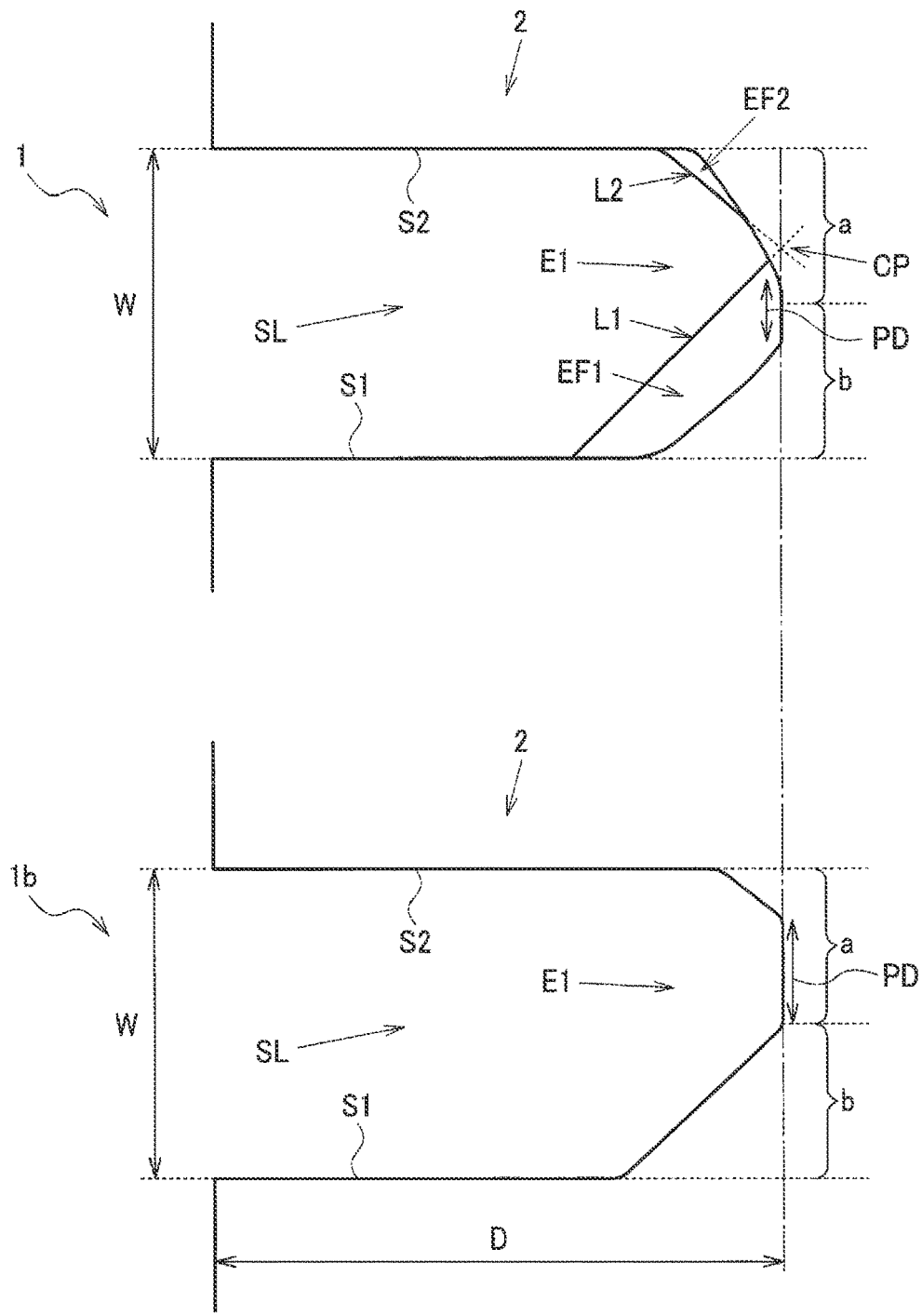
FIG. 5 is a diagram showing a difference between the structure according to the embodiment and that according to a second comparative example.
Figure 5:
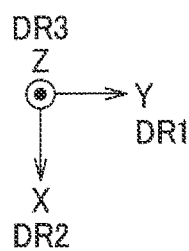

FIG. 5 is a diagram showing a difference between the structure 1 according to the embodiment and a structure 1b according to a second comparative example. In FIG. 5, an upper part shows the shape of the slit SL in the structure 1 in a plan view, and a lower part shows a shape of the slit SL in the structure 1b in a plan view, similarly to FIG. 4. A shape of the structure 1b according to the second comparative example in the plan view is different from the shape of the structure 1a according to the first comparative example in the plan view in that an inner wall of the slit SL does not include ridge-shaped undulations with the first straight line L1 and the second straight line L2 as ridge lines, and the intersection point CP is not present. Therefore, in the second comparative example, a stress caused by distortion of the structure 1b is less likely to be concentrated on a specific portion. Since the slit SL whose inner wall does not include undulations as in the second comparative example is formed by, for example, dry etching, which requires much time in cost. A method for forming the slit SL in the structure 1 will be described later with reference to FIG. 14 and the like, and the slit SL in the structure 1 can be formed in a shorter time by the wet etching, thereby reducing a manufacturing cost.

2. Physical Quantity Sensor

Figure 6:
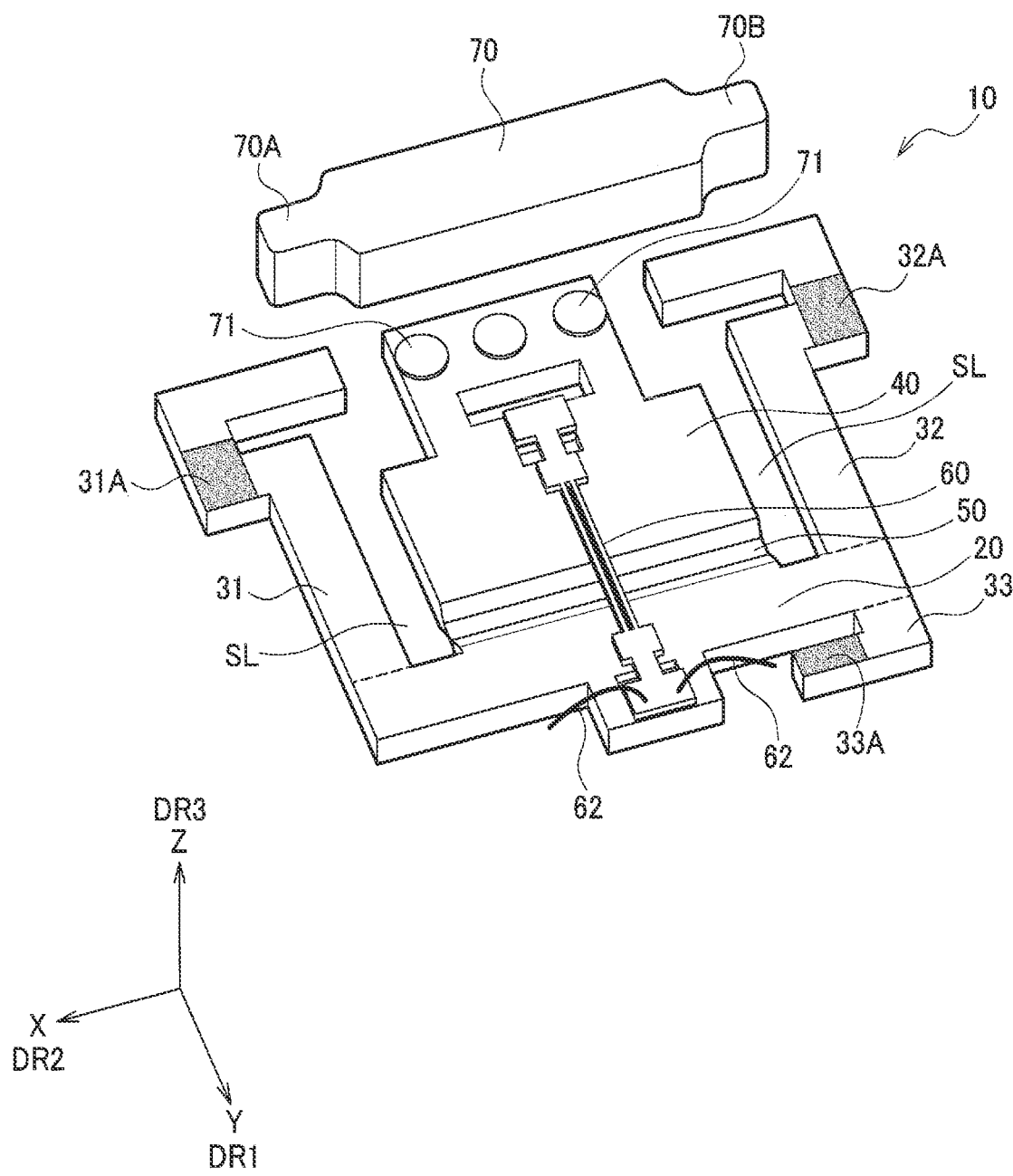
FIG. 6 is a perspective view of a physical quantity sensor according to the embodiment.
Figure 9:
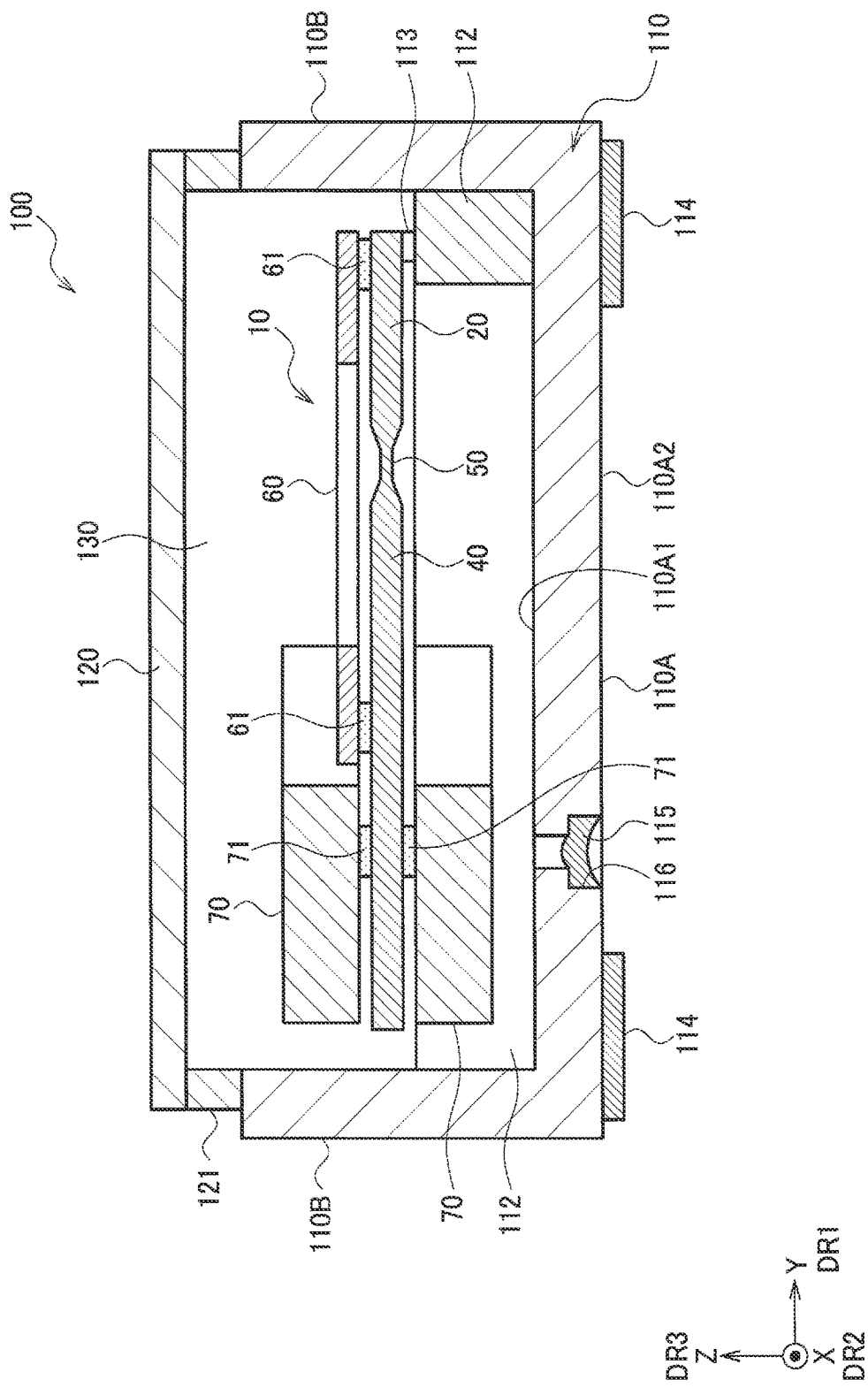
FIG. 9 is a cross-sectional view of the physical quantity sensor according to the embodiment.

FIG. 6 is a perspective view of a physical quantity sensor 10 according to the embodiment. The physical quantity sensor 10 includes a base portion 20, arm portions 31, 32, 33, a movable portion 40, a constricted portion 50, and a oscillator 60. The number of the arm portions 31, 32, 33 may be at least two. The arm portion 31, the arm portion 32, and the arm portion 33 are coupled to the base portion 20 at proximal end portions thereof, and preferably provided, at distal end portions thereof, with a fixing region 31A, a fixing region 32A, and a fixing region 33A, respectively. The constricted portion 50 is disposed between the base portion 20 and the movable portion 40, and couples the base portion 20 and the movable portion 40. The oscillator 60 includes, for example, a quartz crystal oscillator of a double tuning fork type, and detects physical quantities such as an acceleration, an angular velocity, and a pressure. The oscillator 60 is disposed across the constricted portion 50 in a plan view when viewed in a thickness direction (−Z direction) of the base portion 20, and is attached to the base portion 20 and the movable portion 40 via a joining portion 61 such as an adhesive, which will be shown in FIG. 9. A mass portion 70 made of metal such as SUS or copper can be disposed on a free end side of the movable portion 40, which is a cantilever with the constricted portion 50 as a fulcrum. The mass portion 70 is not limited to being provided on a front surface side of the movable portion 40 as shown in FIG. 6, and may be provided on a back surface side of the movable portion 40 as shown in FIG. 9. As shown in FIGS. 6 and 9, the mass portion 70 is attached to the movable portion 40 by joining portions 71 such as an adhesive. The mass portion 70 shown in FIG. 6 moves up and down together with the movable portion 40, and both end portions 70A, 70B of the mass portion 70 also function as stoppers that prevent an excessive amplitude by coming into contact with the arm portions 31 and 32, respectively.

The movable portion 40 is displaced with the constricted portion 50 as a fulcrum in response to a physical quantity such as an acceleration degree or a pressure, for example, so that a stress is generated in the oscillator 60 attached to the base portion 20 and the movable portion 40. A resonance frequency of the oscillator 60 changes due to a stress applied to the oscillator 60. A physical quantity can be detected based on a change in the resonance frequency.

Here, in the physical quantity sensor 10 according to the embodiment, a monolithic structure including the movable portion 40, the constricted portion 50, the base portion 20, and the arm portion 31 corresponds to the structure 1 shown in FIG. 1 and the like. That is, in FIG. 6, the movable portion 40, the constricted portion 50, the base portion 20, and the arm portion 31 are disposed so as to form the slit SL. The movable portion 40, the constricted portion 50, the base portion 20, and the arm portion 32 are also disposed so as to form another slit SL.

When the physical quantity sensor 10 is displaced in an X-axis direction in response to an acceleration or the like, the displacement is absorbed by distortion of the base portion 20 and the arm portion 31 or distortion of the base portion 20 and the arm portion 32. If the intersection point CP based on different crystal planes of the quartz crystal substrate 2 appears on the inner wall of the slit SL corresponding to a side surface of the base portion 20, a stress that cannot be absorbed by the structure is concentrated on the intersection point CP, and the intersection point CP may be a starting point of breakage.

Therefore, in the embodiment, the intersection point CP is not present on the inner wall of the slit SL. Therefore, the stress that cannot be absorbed by the structure can be prevented from being concentrated on a specific portion on the inner wall of the slit SL, and the physical quantity sensor 10 can be prevented from being broken near base portions of the arm portions 31, 32.

Figure 7:
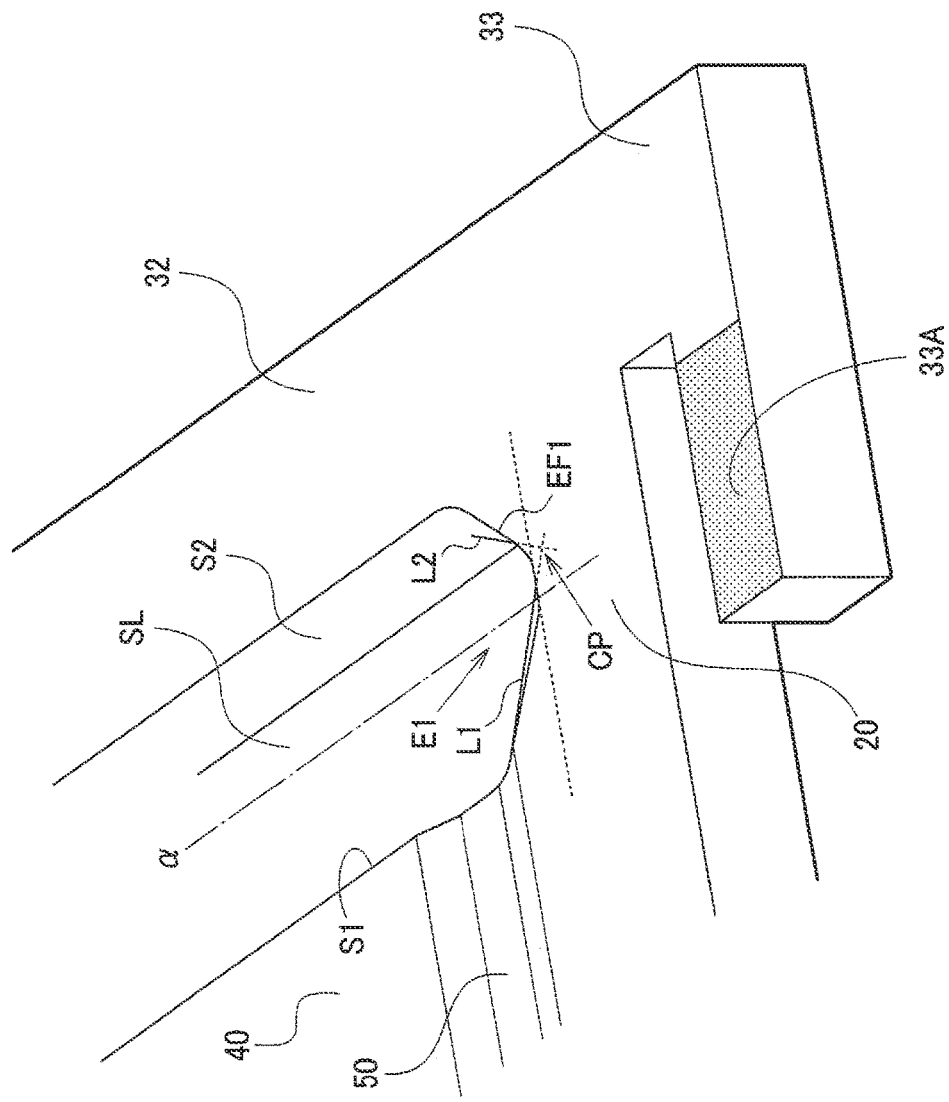
FIG. 7 is a perspective view around a slit of the physical quantity sensor according to the embodiment.
Figure 7:
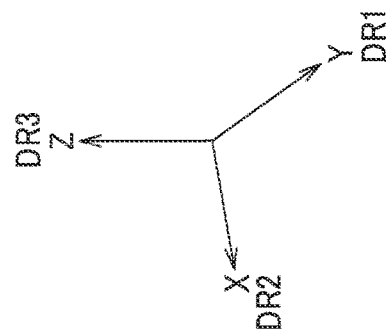

FIG. 7 is a perspective view showing a detailed shape near the first end portion E1 of one slit SL in the physical quantity sensor 10 shown in FIG. 6. Specifically, a positional relationship of the intersection point CP and the end surfaces EF1 to EF4 with respect to the slit SL on an arm portion 32 side is shown. As shown in FIG. 7, a position of the intersection point CP with respect to the slit SL is located closer to the arm portion 32 than is a center of the slit SL in the second direction DR2. In FIG. 7, the one-dot chain line α indicates a central position of the slit SL in the second direction DR2. The intersection point CP is located closer to the arm 32 than is the one-dot chain line α.

Figure 8:
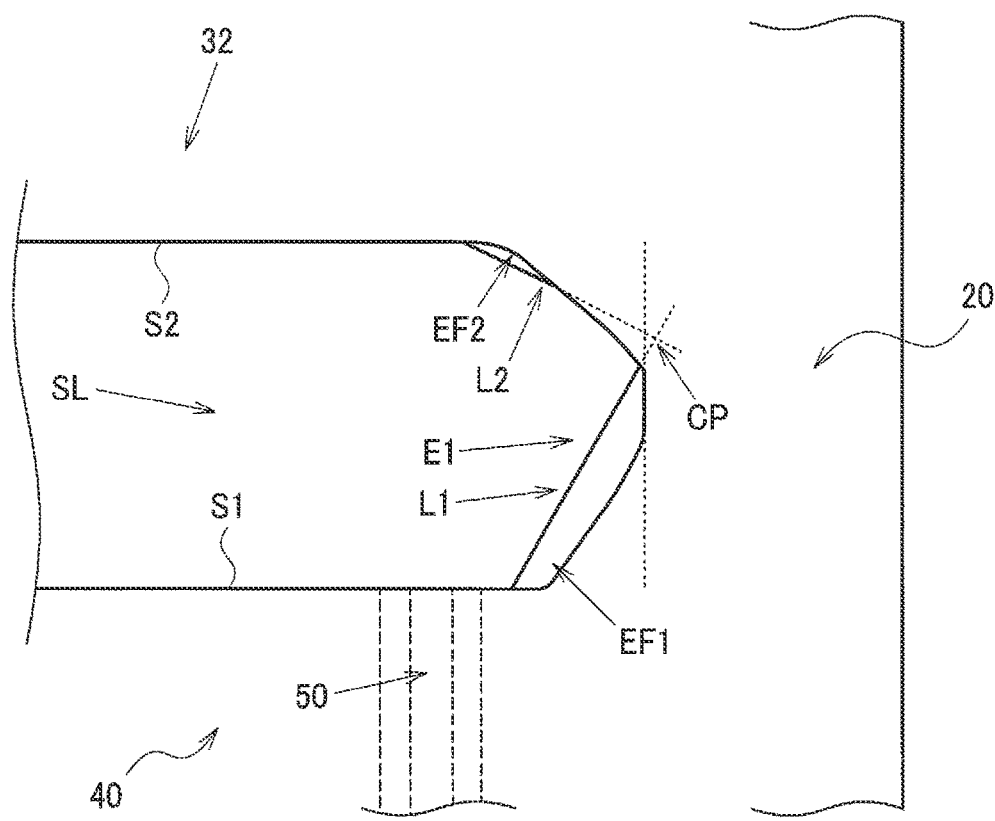
FIG. 8 is a plan view around the slit of the physical quantity sensor according to the embodiment.
Figure 8:
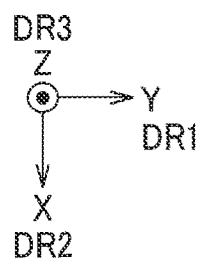

FIG. 8 is a plan view of the physical quantity sensor 10 shown in FIG. 7. As shown in FIG. 8, the intersection point CP is located closer to the arm portion 32 than is the center of the slit SL. The intersection point CP is located in the base portion 20 in the plan view, and does not appear on the inner wall of the slit SL. If the intersection point CP on the arm portion 32 side is present on the inner wall of the slit SL, the intersection point CP is highly likely to be a starting point of breakage caused by displacement in the X-axis direction as compared with that on a movable portion 40 side, but the physical quantity sensor 10 reduces this possibility.

In this way, in the physical quantity sensor 10 according to the embodiment, the intersection point CP of the end surfaces extending along different crystal planes does not appear on the inner wall of the slit SL. Therefore, even when the movable portion 40 is displaced in the X-axis direction and the base portion 20 or the like supporting the movable portion is distorted, it is possible to prevent occurrence of breakage starting from the intersection point CP.

FIG. 9 is a cross-sectional view showing a physical quantity sensor device 100 incorporating the physical quantity sensor 10 in FIG. 6. The physical quantity sensor device 100 includes a base 110 on which the physical quantity sensor 10 is mounted. In the embodiment, the base 110 is implemented as a package base including a bottom portion 110A and side walls 110B. The base 110 forms, together with a lid 120, a package accommodating the physical quantity sensor 10. The lid 120 is joined to an opening end of the base 110 via an adhesive 121. The bottom portion 110A of the base 110 is provided with a step portion 112 that is one step higher than an inner surface 110A1 of the bottom portion 110A along, for example, three side walls 110B among the four side walls 110B. The step portion 112 may protrude from an inner surface of the side wall 110B, and may be integrated with or separated from the base 110, but is a part of the base 110. The physical quantity sensor 10 is fixed to the step portion 112 in the fixing regions 31A, 32A, 33A with an adhesive 113. By using a resin-based adhesive such as an epoxy resin having a high elastic modulus as the adhesive 113, it is possible to absorb a stress and distortion generated at the time of joining and to prevent an adverse effect on the oscillator 60.

In the embodiment, as shown in FIG. 6, the oscillator 60 can be coupled, by wire bondings 62, 62, to electrodes formed on the step portion 112. In this case, it is not necessary to form an electrode pattern on the base portion 20. The electrode pattern provided on the base portion 20 may be coupled to the electrodes formed on the step portion 112 of the base 110 via a conductive adhesive instead of using the wire bondings 62.

The base 110 includes external terminals 114 which are provided on an outer surface 110A2 of the bottom portion 110A and used when mounted on a circuit board 210A shown in FIG. 10 to be described later. The external terminal 114 is electrically coupled to the oscillator 60 via a wiring, an electrode, or the like (not shown).

For example, the bottom portion 110A is provided with a sealing portion 115 that seals a cavity 130 in the package formed by the base 110 and the lid 120. The sealing portion 115 is provided in a through hole 116 formed in the base 110. The sealing portion 115 is provided by disposing a sealing material in the through hole 116, heating and melting the sealing material, and then solidifying the sealing material. The sealing portion 115 is provided to hermetically seal the inside of the package.

Figure 10:
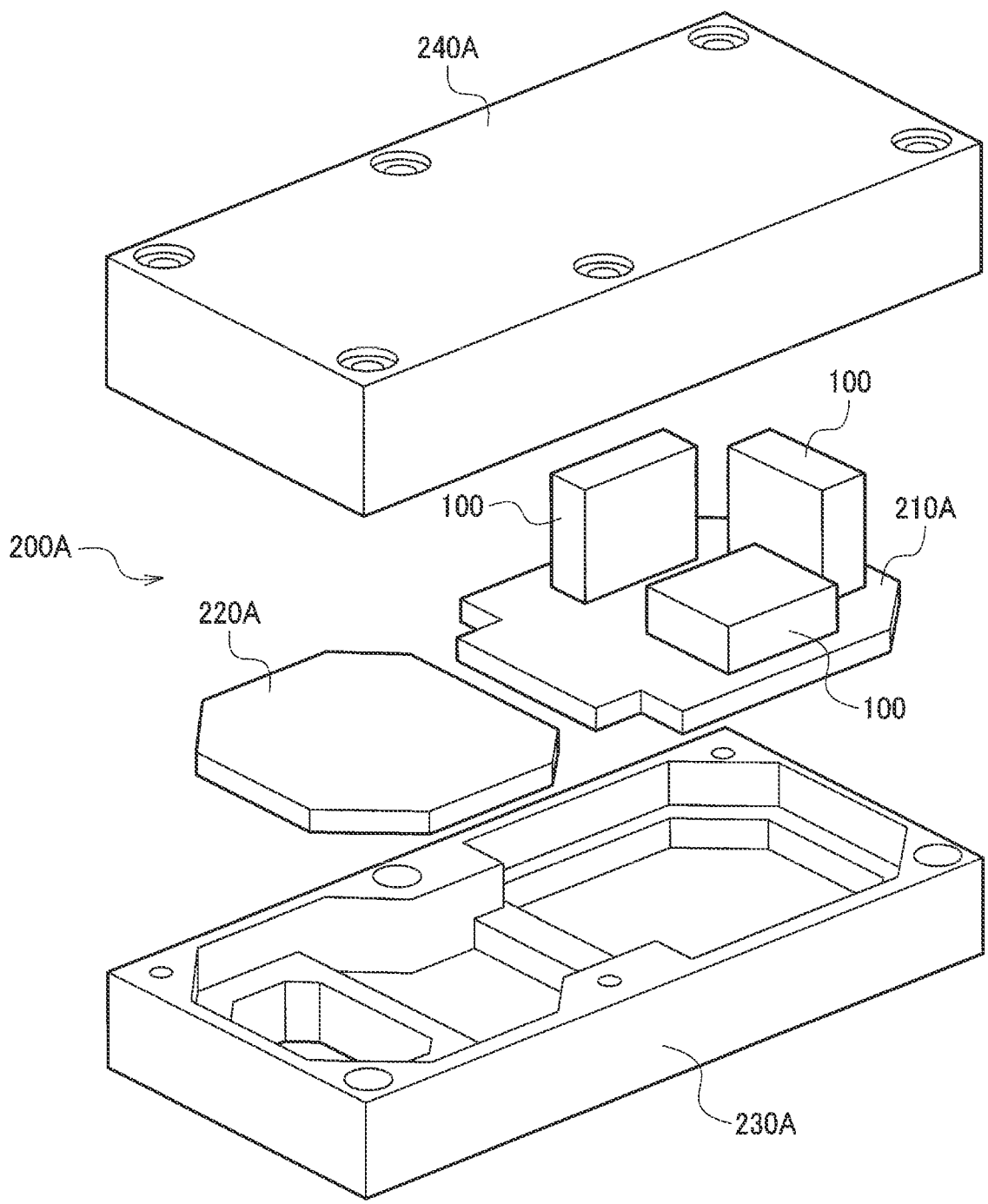
FIG. 10 is an exploded perspective view of a three-axis physical quantity sensor device.

FIG. 10 is an exploded perspective view of a three-axis physical quantity sensor device 200A including three physical quantity sensor devices 100. The physical quantity sensor device 100 is, for example, a one-axis physical quantity sensor device. The physical quantity sensor device 200A includes a circuit board 210A on which the three physical quantity sensor devices 100 are mounted, a connector board 220A, a package base 230A, and a lid 240A. The three physical quantity sensor devices 100 have detection axes along three axes orthogonal to one another, and detect physical quantities in the three axes. The circuit board 210A is electrically coupled to the connector board 220A. The circuit board 210A and the connector board 220A are accommodated and held in a package formed by the package base 230A and the lid 240A.

Figure 11:
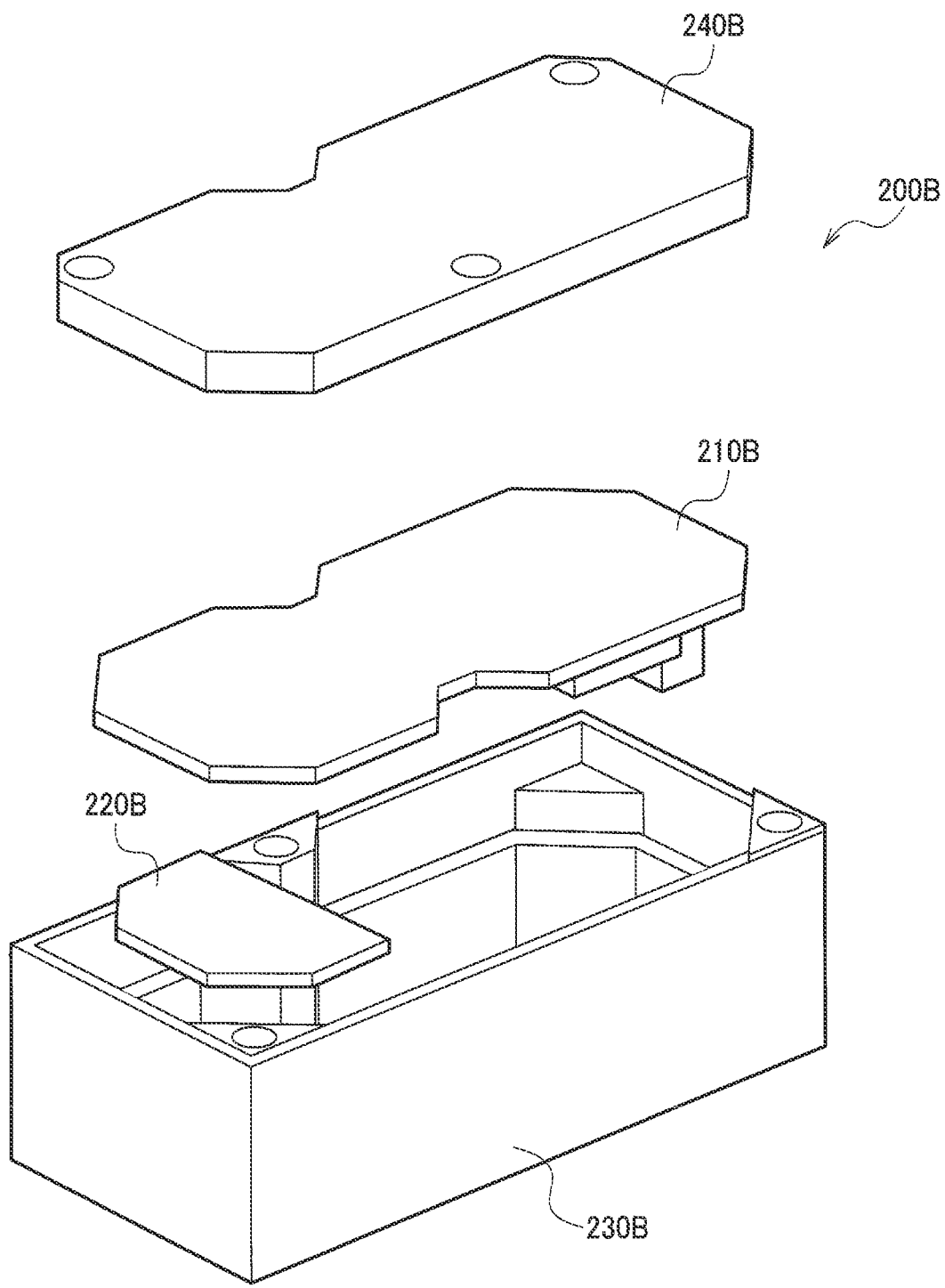
FIG. 11 is an exploded perspective view showing another example of the three-axis physical quantity sensor device.

FIG. 11 shows a three-axis physical quantity sensor device 200B as a modification of the physical quantity sensor device 200A in FIG. 10. The circuit board 210A and the connector board 220A are arranged side by side on the same plane in FIG. 10, while a circuit board 210B and a connector board 220B are arranged side by side in an upper and lower direction in FIG. 11. In FIG. 11, the circuit board 210B and the connector board 220B are accommodated and held in a package formed by a package base 230B and a lid 240B.

As described above, the physical quantity sensor 10 according to the embodiment includes the structure 1 shown in FIG. 1 and the like. A physical quantity detected by the physical quantity sensor 10 is, for example, an acceleration, a velocity, a displacement amount, an angular velocity, an inclination angle, or a pressure. For example, the physical quantity is a physical quantity in the third direction DR3. When the physical quantity sensor 10 is an acceleration sensor, the physical quantity sensor 10 detects an acceleration in the third direction DR3. When the physical quantity sensor 10 is an angular velocity sensor such as a gyro sensor, the physical quantity sensor 10 detects an angular velocity around the third direction DR3, for example. In the case of the angular velocity sensor, a vibrating element of a tuning fork type, an H shape, a double T shape, or the like can be used as a oscillator implemented by the structure 1. The physical quantity sensor 10 may be a pressure sensor, an inclination sensor, a MEMS switch, or the like.

Specifically, as shown in FIGS. 6 to 9 and the like, the physical quantity sensor 10 according to the embodiment includes the oscillator 60 supported by the quartz crystal substrate 2. The quartz crystal substrate 2 includes the base portion 20, the movable portion 40 movable with respect to the base portion 20, and the groove-shaped constricted portion 50 coupling the base portion 20 and the movable portion 40. The oscillator 60 is coupled to the base portion 20 and the movable portion 40 across the constricted portion 50.

According to the embodiment, the shape of the slit SL in the plan view can prevent the intersection point CP of different crystal planes of the quartz crystal substrate 2 from appearing on the inner wall of the slit SL, and thus breakage due to stress starting from the intersection point CP can be prevented. Therefore, it is possible to implement the physical quantity sensor 10 having high resistance to distortion due to the external stress.

In the physical quantity sensor 10 according to the embodiment, the constricted portion 50 is provided along the second direction DR2 orthogonal to the first direction DR1 in the plan view. The first end portion E1, which is an end portion on one end side of the slit SL extending along the first direction DR1, is provided in the base portion 20. The first side surface S1 of the slit SL includes, along the first direction DR1, a side surface of the movable portion 40, a side surface of the constricted portion 50, and a side surface of the base portion 20 extending from the constricted portion 50 to the first end portion E1. The first end surface EF1 and the second end surface EF2 are end surfaces at the first end portion E1.

In the physical quantity sensor 10 according to the embodiment, the quartz crystal substrate 2 includes the arm portions 31, 32 extending from the base portion 20 along the first direction DR1, and the second side surface S2 of the slit SL is a side surface of each of the arm portions 31, 32.

According to the embodiment, the side surface of the movable portion 40 can correspond to the first side surface S1 of the slit SL, and the side surface of each of the arm portions 31, 32 can correspond to the second side surface S2 of the slit SL. Therefore, at the first end portion E1 of the slit SL, the intersection point CP does not appear on the inner wall of the slit SL. Therefore, when a stress is applied to the end portion of the slit SL, breakage starting from the intersection point CP is less likely to occur. Therefore, it is possible to implement the physical quantity sensor 10 having high resistance to distortion with displacement of the movable portion 40.

3. Inertial Sensor

Figure 12:
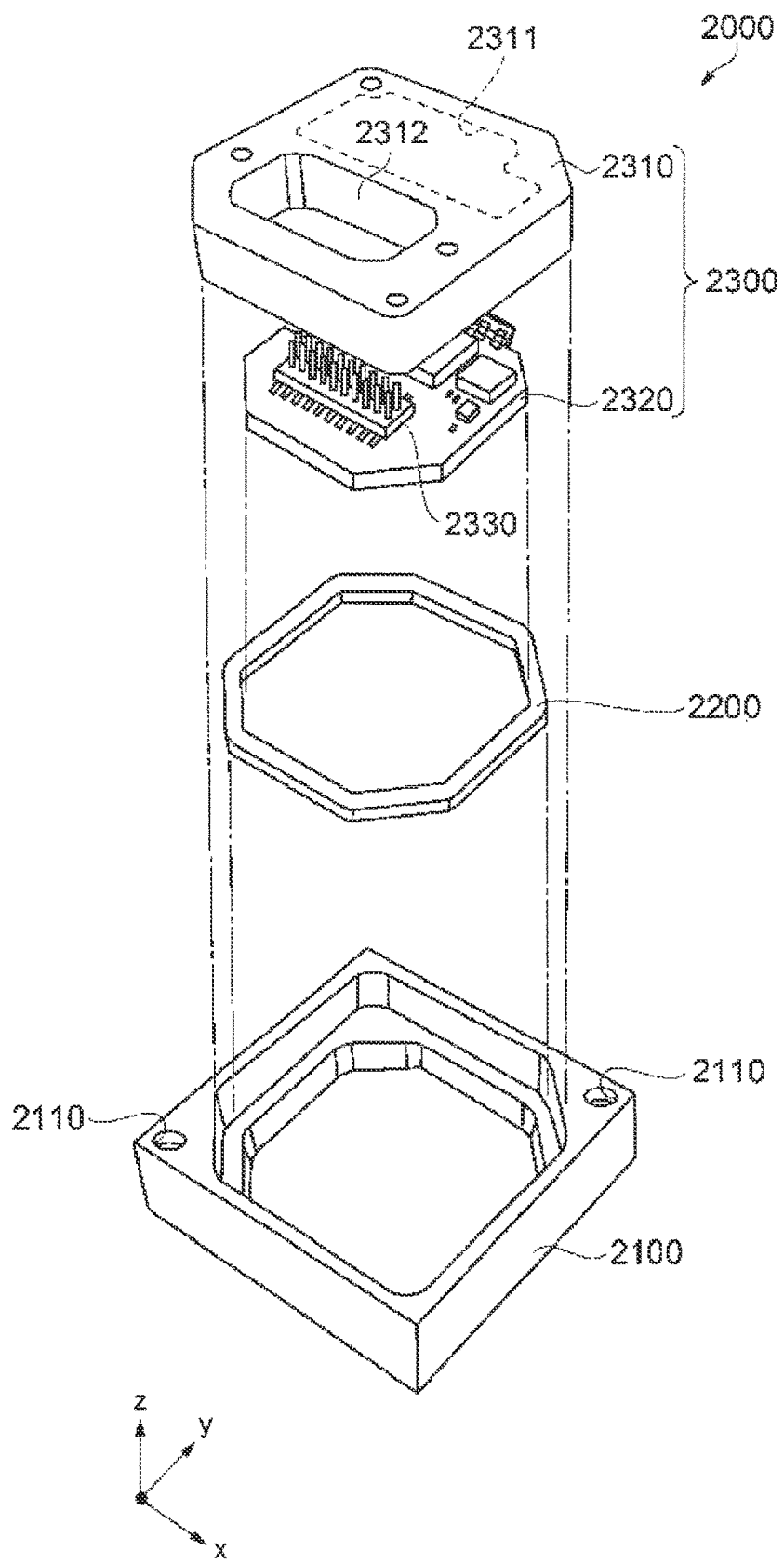
FIG. 12 is an exploded perspective view showing a schematic configuration of an inertial sensor.

Next, an example of an inertial sensor 2000 according to the embodiment will be described with reference to FIGS. 12 and 13. The inertial sensor (inertial measurement unit: IMU) 2000 shown in FIG. 12 is a device that detects an inertial momentum of a posture, a behavior, or the like of a moving body such as an automobile or a robot. The inertial sensor 2000 is, for example, a six-axis motion sensor. The inertial sensor 2000 includes, for example, an acceleration sensor that detects accelerations ax, ay, az in directions along three axes, and an angular velocity sensor that detects angular velocities ωx, ωy, ωz around the three axes.

The inertial sensor 2000 is, for example, a cuboid having a substantially square shape in a plan view as shown in FIG. 12. Screw holes 2110 as mounting portions are formed in the vicinity of two vertices located in a diagonal line direction of a square. The inertial sensor 2000 can be fixed to a mounted surface of a mounted body such as an automobile by inserting two screws into the two screw holes 2110. It is also possible to reduce a size to such a degree that mounting on, for example, a smart phone or a digital camera is possible by selecting components or changing a design.

The inertial sensor 2000 includes an outer case 2100, a joining member 2200, and a sensor module 2300. The sensor module 2300 is inserted into the outer case 2100 with the joining member 2200 interposed therebetween. The sensor module 2300 includes an inner case 2310 and a circuit board 2320. The inner case 2310 has a recess 2311 for preventing contact with the circuit board 2320 and an opening 2312 for exposing a connector 2330 to be described later. The circuit board 2320 is joined to a lower surface of the inner case 2310 by an adhesive.

Figure 13:
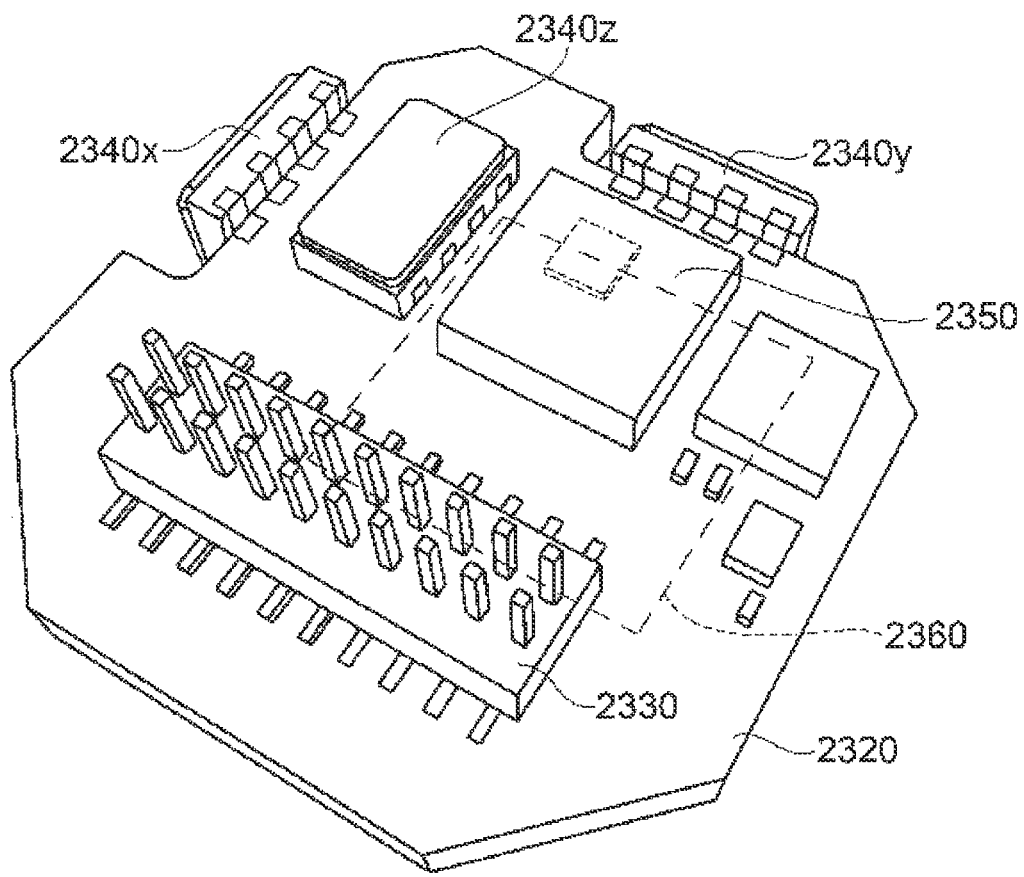
FIG. 13 is a perspective view of a circuit board of the physical quantity sensor.

As shown in FIG. 13, the connector 2330, an angular velocity sensor 2340z that detects an angular velocity around a z axis, an acceleration sensor unit 2350 that detects an acceleration in each axial direction of an x axis, a y axis, and the z axis, and the like are mounted on an upper surface of the circuit board 2320. An angular velocity sensor 2340x that detects an angular velocity around the x axis and an angular velocity sensor 2340y that detects an angular velocity around the y axis are mounted on side surfaces of the circuit board 2320. The inertial sensor 2000 may not include the angular velocity sensors 2340x, 2340y, 2340z. In this case, for example, it is possible to implement the inertial sensor 2000 by accommodating the physical quantity sensor 10 and a control IC 2360 to be described later in a package, which is an accommodating container.

For example, the acceleration sensor unit 2350 includes a first physical quantity sensor, a second physical quantity sensor, and a third physical quantity sensor each corresponding to the physical quantity sensor 10 described above. The first physical quantity sensor detects an acceleration in an x-axis direction. The second physical quantity sensor detects an acceleration in a y-axis direction. The third physical quantity sensor detects an acceleration in a z-axis direction. In this way, the acceleration sensor unit 2350 can detect accelerations in three axial directions. The angular velocity sensors 2340x, 2340y, 2340z are not particularly limited, and for example, a vibration gyro sensor using the Coriolis force can be used.

The control IC 2360 is mounted on a lower surface of the circuit board 2320. The control IC 2360 serving as a control unit that performs control based on a detection signal output from the physical quantity sensor 10 is, for example, a micro controller unit (MCU), incorporates a storage unit including a nonvolatile memory, an A/D converter, and the like, and controls each unit of the inertial sensor 2000. In addition, a plurality of electronic components are mounted on the circuit board 2320.

As described above, the inertial sensor according to the embodiment includes the first physical quantity sensor, the second physical quantity sensor, and the third physical quantity sensor. The first physical quantity sensor detects a first physical quantity on a first detection axis. The second physical quantity sensor detects a second physical quantity on a second detection axis orthogonal to the first detection axis. The third physical quantity sensor detects a third physical quantity on a third detection axis orthogonal to the first detection axis and the second detection axis.

Here, the first physical quantity sensor detects the acceleration in the x-axis direction. That is, the first physical quantity sensor detects the first physical quantity on the x axis as the first detection axis. The second physical quantity sensor detects the acceleration in the y-axis direction. That is, the second physical quantity sensor detects the second physical quantity on the y axis as the second detection axis. The third physical quantity sensor detects the acceleration in the z-axis direction. That is, the third physical quantity sensor detects the third physical quantity on the z axis as the third detection axis. Each of the first to third physical quantity sensors may detect an angular velocity around the detection axis instead of the angular velocity sensors 2340x, 2340y, 2340z.

According to the inertial sensor 2000 of the embodiment, since the acceleration sensor unit 2350 including the physical quantity sensor 10 is used, an effect of the physical quantity sensor 10 can be attained, and it is possible to implement the inertial sensor 2000 having high impact resistance.

4. Method for Manufacturing Structure

FIGS. 14 to 17 show a method for manufacturing the structure 1 according to the embodiment. The manufacturing method according to the embodiment includes a mask forming step and an etching step.

Figure 14:
FIG. 14 is a diagram showing a method for manufacturing the structure according to the embodiment.
Figure 15:
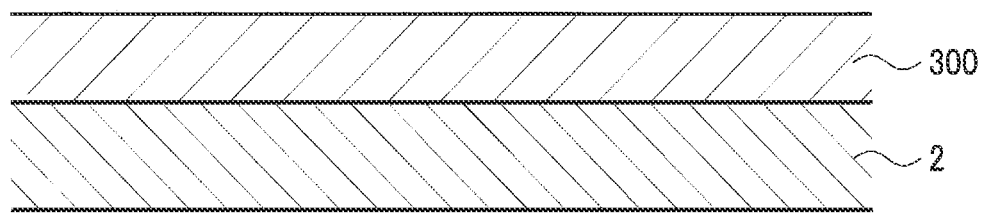
FIG. 15 is a diagram showing the method for manufacturing the structure according to the embodiment.
Figure 16:
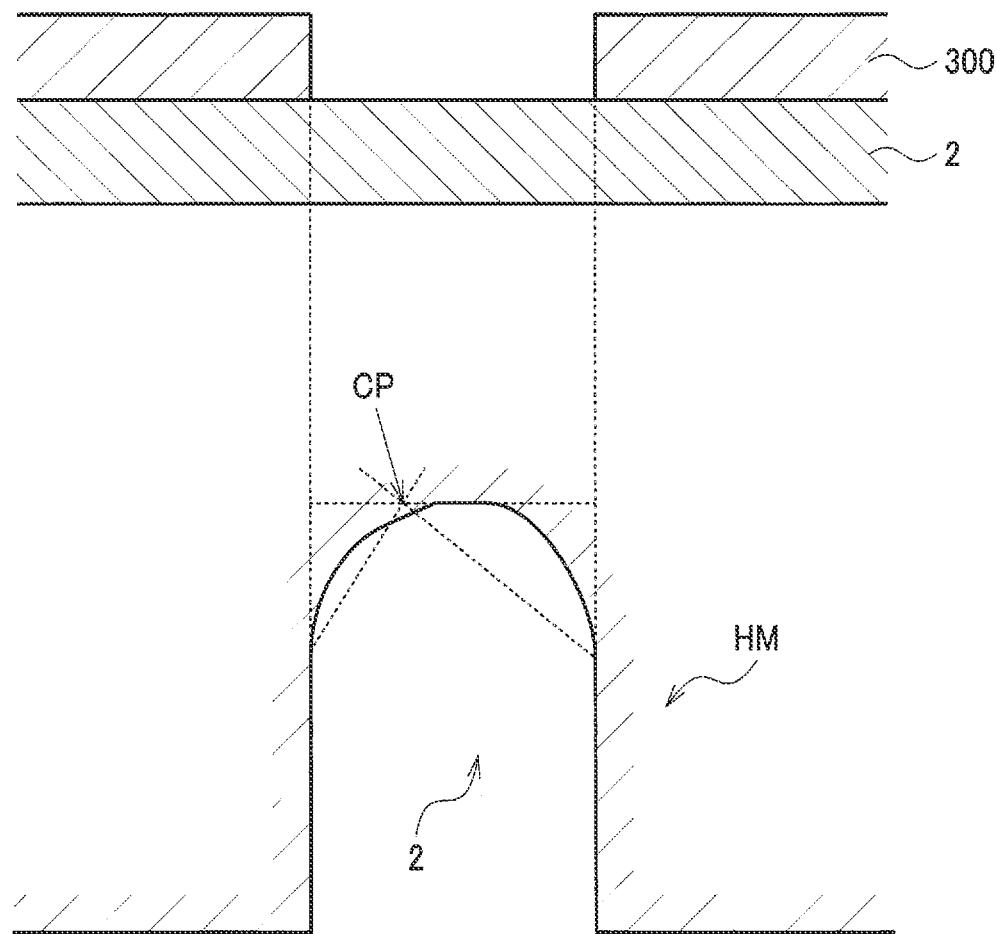
FIG. 16 is a diagram showing the method for manufacturing the structure according to the embodiment.
Figure 16:
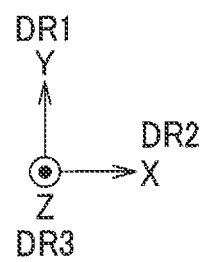

FIGS. 14 to 16 are diagrams showing the mask forming step. FIG. 14 is a cross-sectional view of the quartz crystal substrate 2 before a mask is formed. First, as shown in FIG. 15, a film of a mask material 300 is formed on the quartz crystal substrate 2. The mask material 300 is, for example, a resist or a metal film. Then, as shown in FIG. 16, the mask material 300 is exposed by lithography or the like, and then is subjected to an asking process and processed into a pattern corresponding to the slit SL of the structure 1 according to the embodiment, thereby forming a mask HM. A shape of the mask HM shown in a lower part in FIG. 16 in a plan view is not a substantially right-angled U shape, but substantially corresponds to the shape of the slit SL in the structure according to the embodiment shown in FIG. 2. In the plan view, the mask HM has a shape covering the intersection point CP where the first straight line L1 and the second straight line L2 intersect each other. As described above, the position where the intersection point CP appears changes depending on how the quartz crystal substrate 2 and the slit SL are oriented. The lower part in FIG. 16 shows an example of the position of the intersection point CP in the second direction DR2 when the quartz crystal substrate 2 and the slit SL are oriented in a specific manner.

Figure 17:
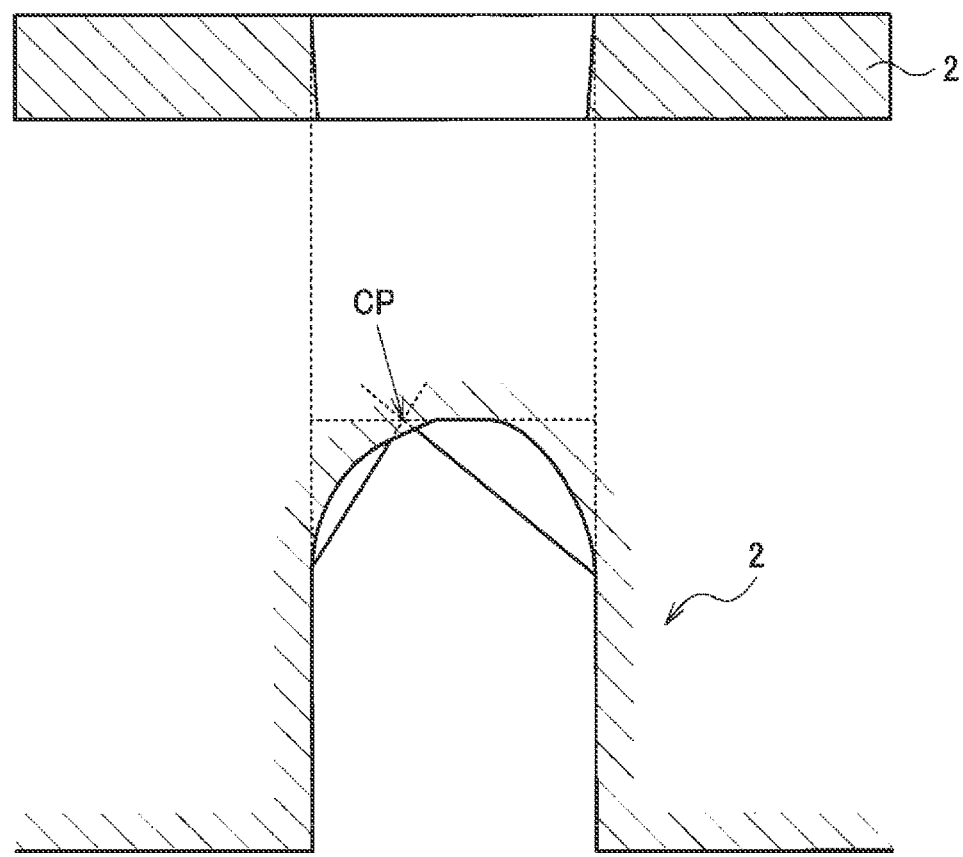
FIG. 17 is a diagram showing the method for manufacturing the structure according to the embodiment.
Figure 17:
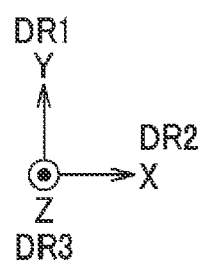

FIG. 17 is a diagram showing the etching step. As shown in FIG. 17, the quartz crystal substrate 2 is etched using the mask HM patterned in the mask forming step. Wet etching can be used as the etching, and hydrofluoric acid, for example, is used as a chemical solution. FIG. 17 shows a shape of the quartz crystal substrate 2 in a cross-sectional view and a plan view after the etching. As shown in FIG. 2 and the like, the intersection point CP of the slit SL is located inside the quartz crystal substrate 2 in the plan view, and does not appear on the inner wall of the slit SL. Therefore, a stress due to an external stress is prevented from being concentrated on a specific portion on a surface of the quartz crystal substrate 2. As shown in an upper part in FIG. 17, the wet etching tends to cause isotropic peeling-off, and a cross-sectional shape of the inner wall of the slit SL is slightly tapered.

That is, the manufacturing method according to the embodiment is a manufacturing method for manufacturing the structure 1 formed of the quartz crystal substrate 2, and includes the mask forming step and the etching step. In the mask forming step, the mask HM is formed on the quartz crystal substrate 2. In the etching step, the slit SL is formed in the quartz crystal substrate 2 by etching the quartz crystal substrate 2 using the mask HM. In the etching step, the mask HM having the shape covering the intersection point CP where the first straight line L1 and the second straight line L2 intersect each other is used. In the plan view of the quartz crystal substrate 2, the first straight line L1 corresponds to the first end surface EF1 formed at the end portion of the slit SL and extending along the first crystal plane of the quartz crystal substrate 2. In the plan view of the quartz crystal substrate 2, the second straight line L2 corresponds to the second end surface EF2 formed at the end portion of the slit SL and extending along the second crystal plane of the quartz crystal substrate 2.

As shown in FIG. 2, when the quartz crystal substrate 2 is processed by etching to form the slit SL, the position where the intersection point CP appears changes depending on the angle between the crystal orientation of the quartz crystal substrate 2 and the longitudinal direction of an opening of the slit SL. Therefore, if the angle is determined to be a given angle, it is possible to predict in advance a position on the inner wall of the slit SL where the intersection point CP appears. Then, the mask HM is processed into a shape for covering the predicted position of the intersection point CP in the plan view, whereby the quartz crystal substrate 2 can be formed into the shape according to the embodiment. That is, depending on how the quartz crystal substrate 2 and the slit SL are oriented, the quartz crystal substrate 2 can be etched by using the mask HM with which the intersection point CP does not appear.

When the slit SL is formed by dry etching, the dry etching tends to be less likely to exhibit crystal orientation anisotropy of an etching rate as compared with wet etching. On the other hand, wet etching is suitable for a batch process, can attain high throughput, and is a process excellent in mass productivity. Therefore, the manufacturing method according to the embodiment exhibits a remarkable effect particularly when forming the slit SL in the structure 1 by wet etching.

As described above, a structure according to the embodiment relates to a structure of a quartz crystal substrate having a slit. The structure includes, as an inner wall of the slit, a first side surface, a second side surface, a first end surface, and a second end surface. The first side surface may extend along a first direction which is a longitudinal direction of the slit, and the second side surface may extend along the first direction. The first end surface may be continuous with the first side surface and extend along a first crystal plane of the quartz crystal substrate. The second end surface may be continuous with the second side surface and extend along a second crystal plane of the quartz crystal substrate. In a plan view of the quartz crystal substrate, an intersection point where a first straight line corresponding to the first end surface and a second straight line corresponding to the second end surface intersect each other is located inside the quartz crystal substrate.

According to the embodiment, the intersection point where different crystal planes of the quartz crystal substrate intersect each other does not appear on the inner wall of the slit. Therefore, even when the structure is distorted and a stress is concentrated on the inner wall of the slit, it is possible to prevent occurrence of breakage starting from the intersection point of crystal planes.

In the structure according to the embodiment, the structure may further include, as the inner wall of the slit, a third end surface continuous with the first side surface and extending along a third crystal plane of the quartz crystal substrate; and a fourth end surface continuous with the second side surface and extending along a fourth crystal plane of the quartz crystal substrate. The first straight line is a ridge line where the first end surface and the third end surface intersect each other, and the second straight line is a ridge line where the second end surface and the fourth end surface intersect each other.

With this configuration, on the inner wall of the slit on a first direction side, the first end surface and the third end surface form a ridge-shaped undulation with the first straight line as a ridge line. On the inner wall of the slit on the first direction side, the second end surface and the fourth end surface form a ridge-shaped undulation with the second straight line as a ridge line.

The embodiment relates to a physical quantity sensor including the structure described above. With this configuration, in the physical quantity sensor including the structure, it is possible to prevent occurrence of breakage starting from the intersection point of crystal planes in the structure.

A physical quantity sensor according to the embodiment may include an oscillator supported by the structure. The structure may include a base portion, a movable portion movable with respect to the base portion, and a groove-shaped constricted portion coupling the base portion and the movable portion. The oscillator may be coupled to the base portion and the movable portion across the constricted portion.

With this configuration, the intersection point of the different crystal planes of the quartz crystal substrate does not appear on the inner wall of the slit, and a starting point of breakage due to a stress can be prevented from being formed. Therefore, when the movable portion is displaced due to a stress from the outside and is distorted around the slit due to the displacement, the breakage starting from the intersection point is less likely to occur, and it is possible to implement the physical quantity sensor having high resistance to the distortion due to the external stress.

In the physical quantity sensor according to the embodiment, the constricted portion may be provided along a second direction orthogonal to the first direction in the plan view. A first end portion on one end side of the slit extending along the first direction may be provided in the base portion. The first side surface of the slit may include, along the first direction, a side surface of the movable portion, a side surface of the constricted portion, and a side surface of the base portion extending from the constricted portion to the first end portion. The first end surface and the second end surface may be end surfaces at the first end portion.

With this configuration, the side surface of the movable portion, the side surface of the constricted portion, and the side surface of the base portion extending from the constricted portion to the first end portion correspond to the first side surface of the slit in the structure. Therefore, even when a portion including the constricted portion and the base portion, which support the movable portion, is distorted, since the intersection point is not present on the inner wall of the slit in the first end portion of the slit, breakage starting from the intersection point is less likely to occur.

In the physical quantity sensor according to the embodiment, the structure may include an arm portion extending from the base portion along the first direction, and the second side surface of the slit may be a side surface of the arm portion.

With this configuration, the side surface of the movable portion corresponds to the first side surface of the slit, and the side surface of the arm portion corresponds to the second side surface of the slit. Then, in the first end portion of the slit, the intersection point can be prevented from appearing on the inner wall. Therefore, even when the first end portion of the slit is distorted, breakage starting from the intersection point is less likely to occur.

An inertial sensor according to the embodiment includes a first physical quantity sensor, a second physical quantity sensor, and a third physical quantity sensor. The first physical quantity sensor detects a first physical quantity on a first detection axis. The second physical quantity sensor detects a second physical quantity on a second detection axis orthogonal to the first detection axis. The third physical quantity sensor is the physical quantity sensor described in FIGS. 6 and 9, and detects a third physical quantity on a third detection axis orthogonal to the first detection axis and the second detection axis.

According to the inertial sensor of the embodiment, by using an acceleration sensor unit including the physical quantity sensor described above, an effect of the physical quantity sensor described above can be attained, and it is possible to implement the inertial sensor having high impact resistance.

A manufacturing method according to the embodiment is a manufacturing method for manufacturing a structure of a quartz crystal substrate, and may include a mask forming step and an etching step. In the mask forming step, a mask is formed on the quartz crystal substrate. In the etching step, a slit may be formed in the quartz crystal substrate by etching the quartz crystal substrate using the mask. The mask having a shape covering an intersection point where a first straight line and a second straight line intersect each other can be used in the etching step. In a plan view of the quartz crystal substrate, the first straight line corresponds to, for example, a first end surface formed at an end portion of the slit and extending along a first crystal plane of the quartz crystal substrate. In the plan view of the quartz crystal substrate, the second straight line corresponds to, for example, a second end surface formed at the end portion of the slit and extending along a second crystal plane of the quartz crystal substrate.

According to the embodiment, the structure is manufactured by forming the mask with which the intersection point of different crystal planes does not appear on the inner wall of the slit, and etching the quartz crystal substrate using the mask, whereby a stress is prevented from being concentrated on a specific portion even when the structure is distorted. Therefore, it is possible to implement the structure having high resistance to distortion.

Although the embodiment has been described in detail above, it will be easily understood by those skilled in the art that many modifications can be made without substantially departing from the novel matters and effects according to the present disclosure. Therefore, all such modifications are intended to be included within the scope of the present disclosure. For example, a term described at least once together with a different term having a broader meaning or the same meaning in the description or the drawings can be replaced with the different term at any place in the description or the drawings. All combinations of the embodiment and the modifications are also included in the scope of the present disclosure. Configurations and operations of the structure, the physical quantity sensor, and the inertial sensor, and a configuration of the method for manufacturing the structure are not limited to those described in the embodiment, and various modifications can be made.

What is claimed is:

1. A structure of a quartz crystal substrate having a slit penetrating both main surfaces of the quartz crystal substrate and having one closed end in a longitudinal direction of the slit, which is a first direction along the main surfaces, the structure comprising:
   as an inner wall of the slit,
   a first side surface extending along the first direction;
   a second side surface extending along the first direction;
   a first end surface being part of the closed end, continuous with the first side surface, having a different orientation from the first side surface, and extending along a first crystal plane of the quartz crystal substrate; and
   a second end surface being part of the closed end, continuous with the second side surface, having a different orientation from the second side surface, and extending along a second crystal plane of the quartz crystal substrate, wherein
   in a plan view of the quartz crystal substrate viewed perpendicular to the main surfaces, an intersection point where a first straight line corresponding to the first end surface and a second straight line corresponding to the second end surface intersect each other is located inside the quartz crystal substrate.

2. The structure according to claim 1, further comprising:
   as the inner wall of the slit,
   a third end surface being a part of the closed end, continuous with the first side surface, having a different orientation from the first side surface, and extending along a third crystal plane of the quartz crystal substrate; and
   a fourth end surface being a part of the closed end, continuous with the second side surface, having a different orientation from the second side surface, and extending along a fourth crystal plane of the quartz crystal substrate, wherein
   the first straight line is a ridge line where the first end surface and the third end surface intersect each other, and
   the second straight line is a ridge line where the second end surface and the fourth end surface intersect each other.

3. A physical quantity sensor comprising:
   the structure according to claim 1.

4. The physical quantity sensor according to claim 3, further comprising:
   a oscillator supported by the structure, wherein
   the structure includes
      a base portion,
      a movable portion movable with respect to the base portion, and
      a groove-shaped constricted portion coupling the base portion and the movable portion, and
   the oscillator is coupled to the base portion and the movable portion across the constricted portion.

5. The physical quantity sensor according to claim 4, wherein
   the constricted portion is provided along a second direction orthogonal to the first direction in the plan view,
   the closed end is provided in the base portion,
   the first side surface of the slit includes, along the first direction, a side surface of the movable portion, a side surface of the constricted portion, and a side surface of the base portion extending from the constricted portion to the closed end.

6. The physical quantity sensor according to claim 5, wherein
   the structure includes an arm portion extending from the base portion along the first direction, and
   the second side surface of the slit is a side surface of the arm portion.

7. An inertial sensor comprising:
   a first physical quantity sensor configured to detect a first physical quantity on a first detection axis;
   a second physical quantity sensor configured to detect a second physical quantity on a second detection axis orthogonal to the first detection axis; and
   a third physical quantity sensor, which is the physical quantity sensor according to claim 3, configured to detect a third physical quantity on a third detection axis orthogonal to the first detection axis and the second detection axis.

8. A manufacturing method for manufacturing a structure of a quartz crystal substrate having a slit penetrating both main surfaces of the quartz crystal substrate and having one closed end in a longitudinal direction of the slit, which is a first direction along the main surfaces, the method comprising:
   a mask forming step of forming a mask on the quartz crystal substrate; and
   an etching step of forming the slit in the quartz crystal substrate by etching the quartz crystal substrate using the mask, wherein the mask having a shape covering an intersection point where a first straight line and a second straight line intersect each other is used in the etching step, in a plan view of the quartz crystal substrate, the first straight line corresponding to a first end surface being part of the closed end formed at an end portion of the slit and extending along a first crystal plane of the quartz crystal substrate, and the second straight line corresponding to a second end surface being part of the closed end formed at the end portion of the slit and extending along a second crystal plane of the quartz crystal substrate, the mask forming step including processing the shape of the mask based on a predicted intersection point of the first straight line and the second straight line, and the etching step includes forming the slit so that, as an inner wall of the slit, a first side surface and a second side surface extend along the first direction, the first end surface is continuous with the first side surface and has a different orientation from the first side surface, and the second end surface is continuous with the second side surface and has a different orientation from the second side surface.

9. A physical quantity sensor comprising:
a structure of a quartz crystal substrate having a slit; and
an oscillator supported by the structure,
wherein the structure comprises:
   a base portion;
   a movable portion movable with respect to the base portion;
   a groove-shaped constricted portion coupling the base portion and the movable portion; and
   as an inner wall of the slit,
     a first side surface extending along a first direction which is a longitudinal direction of the slit;
     a second side surface extending along the first direction;
     a first end surface continuous with the first side surface and extending along a first crystal plane of the quartz crystal substrate; and
     a second end surface continuous with the second side surface and extending along a second crystal plane of the quartz crystal substrate,
wherein in a plan view of the quartz crystal substrate, an intersection point where a first straight line corresponding to the first end surface and a second straight line corresponding to the second end surface intersect each other is located inside the quartz crystal substrate, and
the oscillator is coupled to the base portion and the movable portion across the constricted portion.

10. The physical quantity sensor according to claim 9, wherein
the constricted portion is provided along a second direction orthogonal to the first direction in the plan view,
an end portion on one end side of the slit extending along the first direction is provided in the base portion,
the first side surface of the slit includes, along the first direction, a side surface of the movable portion, a side surface of the constricted portion, and a side surface of the base portion extending from the constricted portion to the end portion, and
the first end surface and the second end surface are end surfaces at the end portion.

11. The physical quantity sensor according to claim 10, wherein
the structure includes an arm portion extending from the base portion along the first direction, and
the second side surface of the slit is a side surface of the arm portion.

12. An inertial sensor comprising:
a first physical quantity sensor configured to detect a first physical quantity on a first detection axis;
a second physical quantity sensor configured to detect a second physical quantity on a second detection axis orthogonal to the first detection axis; and
a third physical quantity sensor, which is the physical quantity sensor according to claim 9, configured to detect a third physical quantity on a third detection axis orthogonal to the first detection axis and the second detection axis.

* * * * *